(12) United States Patent
Ji et al.

(10) Patent No.: US 12,164,785 B2
(45) Date of Patent: Dec. 10, 2024

(54) STORAGE DEVICE PREVENTING LOSS OF DATA IN SITUATION OF LACKING POWER AND OPERATING METHOD THEREOF

(71) Applicant: SAMSUNG ELECTRONICS CO., LTD., Suwon-si (KR)

(72) Inventors: Soo-Young Ji, Suwon-si (KR); Younggeon Yoo, Suwon-si (KR); Sang-Hwa Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 18/196,671

(22) Filed: May 12, 2023

(65) Prior Publication Data

US 2023/0384946 A1 Nov. 30, 2023

(30) Foreign Application Priority Data

May 31, 2022 (KR) .................. 10-2022-0067035
Aug. 26, 2022 (KR) .................. 10-2022-0107855

(51) Int. Cl.
*G06F 12/00* (2006.01)
*G06F 1/30* (2006.01)
*G06F 3/06* (2006.01)

(52) U.S. Cl.
CPC .............. *G06F 3/0619* (2013.01); *G06F 1/30* (2013.01); *G06F 3/0631* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 8,560,639 B2 | 10/2013 | Murphy et al. | |
| 10,401,935 B2 | 9/2019 | Brennan et al. | |
| 2010/0274762 A1 | 10/2010 | Murphy et al. | |
| 2017/0277445 A1* | 9/2017 | Kim | G06F 3/0653 |
| 2017/0322611 A1 | 11/2017 | Brennan et al. | |
| 2018/0018245 A1 | 1/2018 | Kori et al. | |
| 2018/0349225 A1 | 12/2018 | Bishnoi et al. | |
| 2020/0081781 A1 | 3/2020 | Akutsu et al. | |
| 2020/0142472 A1* | 5/2020 | Golov | G06F 9/4418 |
| 2021/0240624 A1* | 8/2021 | Stonelake | G06F 1/3275 |
| 2022/0139455 A1 | 5/2022 | Peddle et al. | |

FOREIGN PATENT DOCUMENTS

KR 10-2017-0124952 A 11/2017

* cited by examiner

*Primary Examiner* — Daniel D Tsui
(74) *Attorney, Agent, or Firm* — Sughrue Mion, PLLC

(57) ABSTRACT

The present disclosure provides methods and apparatuses for data loss prevention of a storage device. In some embodiments, the data loss preventing method includes receiving, from a host system, a query plan corresponding to necessary data to be stored in a volatile memory. The data loss preventing method further includes generating, based on the query plan, a data priority list corresponding to the necessary data. The data loss preventing method further includes selecting, based on the data priority list, at least one portion of the volatile memory, when a main power supplied by the host system drops to or below a power level threshold. The data loss preventing method further includes moving the necessary data to the at least one portion of the volatile memory.

20 Claims, 12 Drawing Sheets

STORAGE DEVICE PREVENTING LOSS OF DATA IN SITUATION OF LACKING POWER AND OPERATING METHOD THEREOF

CROSS-REFERENCE TO RELATED APPLICATIONS

This application claims priority under 35 U.S.C. § 119 to Korean Patent Application No. 10-2022-0067035, filed on May 31, 2022, and Korean Patent Application No. 10-2022-0107855 filed on Aug. 26, 2022, in the Korean Intellectual Property Office, the disclosures of which are incorporated by reference herein in their entireties.

BACKGROUND

1. Field

The present disclosure relates generally to storage devices, and more particularly, to a storage device for preventing data loss in a situation of lacking power, and an operating method thereof.

2. Description of Related Art

Related semiconductor memory devices may be classified into volatile semiconductor memory devices and a nonvolatile semiconductor memory devices. Related volatile semiconductor memory device may have fast read and/or write speeds but may lose the data stored therein when power is not supplied thereto. In contrast, related nonvolatile semiconductor memory devices may retain data stored therein even when power is not supplied thereto. For at least this reason, related nonvolatile semiconductor memory devices may be used to store information that may need to be retained regardless of whether power is supplied thereto.

A related storage device may include a nonvolatile memory device and/or a volatile memory device. For example, the related storage device may use the volatile memory device as a buffer memory that temporarily stores data to be stored in the nonvolatile memory device. However, when a sudden power shortage (e.g., sudden power off (SPO) and/or power glitch) occurs, data temporarily stored in the volatile memory device may be lost. In this case, the related storage device may perform a data flushing operation of dumping data stored in the volatile memory device to the nonvolatile memory device.

SUMMARY

Embodiments of the present disclosure provide a storage device that protects data stored in a volatile memory until the main power of a host system is restored, by moving data, which is scattered and stored in the volatile memory, to a partial area of the volatile memory and supplying a spare power supply to only the partial area of the volatile memory to which the data is moved, when sudden main power shortage (e.g., sudden power off (SPO) or power glitch) of the host system occurs.

According to an aspect of the present disclosure, a data loss preventing method of a storage device is provided. The data loss preventing method includes receiving, from a host system, a query plan corresponding to necessary data to be stored in a volatile memory. The data loss preventing method further includes generating, based on the query plan, a data priority list corresponding to the necessary data. The data loss preventing method further includes selecting, based on the data priority list, at least one portion of the volatile memory, when a main power supplied by the host system drops to or below a power level threshold. The data loss preventing method further includes moving the necessary data to the at least one portion of the volatile memory.

In some embodiments, the data loss preventing method may further include partitioning the volatile memory into a plurality of partial areas, allocating the necessary data into a respective plurality of portions corresponding to the plurality of partial areas, and storing the respective plurality of portions of the necessary data into the corresponding plurality of partial areas.

In some embodiments, the data loss preventing method may further include selecting a partial area from among the plurality of partial areas of the volatile memory allocated to a corresponding portion of the respective plurality of portions of the necessary data having a size matching a largest size from among the respective plurality of portions of the necessary data.

In some embodiments, the data loss preventing method may further include selecting at least one partial area from among the plurality of partial areas of the volatile memory allocated to at least one corresponding portion of the respective plurality of portions of the necessary data having a size greater than or equal to a specified size.

In some embodiments, the data loss preventing method may further include selecting, based on the data priority list, at least one partial area from among the plurality of partial areas of the volatile memory allocated to at least one corresponding portion of the respective plurality of portions of the necessary data comprising valid necessary data to be performed first after the main power drops to or below the power level threshold.

In some embodiments, the data loss preventing method may further include selecting a partial area from among the plurality of partial areas of the volatile memory allocated to a corresponding portion of the respective plurality of portions of the necessary data having a largest size from among the plurality of portions of the valid necessary data.

In some embodiments, the data loss preventing method may further include preventing moving invalid necessary data, based on the data priority list, to the at least one portion of the volatile memory, when the main power supplied by the host system drops to or below the power level threshold.

In some embodiments, the data loss preventing method may further include supplying spare power to the volatile memory through at least one of an internal spare power source and an external spare power source, when the main power supplied from the host system drops to or below the power level threshold.

In some embodiments, the data loss preventing method may further include shutting off a supply of the spare power supplied to an unselected portion of the volatile memory, after the necessary data has been moved to the at least one portion of the volatile memory.

According to an aspect of the present disclosure, a storage device is provided. The storage device includes a nonvolatile memory, a volatile memory, and a processor. The nonvolatile memory is configured to perform, in response to a request of a host system, at least one of an input data operation and an output data operation. The volatile memory is configured to store necessary data used for the at least one of the input data operation and the output data operation. The processor is configured to control the at least one of the input data operation and the output data operation. The processor is further configured to receive, from the host system, a query plan corresponding to the necessary data. The processor is further configured to generate, based on the query plan, a data priority list corresponding to the necessary data. The processor is further configured to select, based on the data priority list, a first partial area of the volatile memory, when a main power supplied by the host system drops to or below a power level threshold. The processor is further configured to move the necessary data to the first partial area of the volatile memory.

In some embodiments, the volatile memory of the storage device may include a plurality of partial areas. The plurality of partial areas may include the first partial area. The necessary data may be divided into a respective plurality of portions corresponding to the plurality of partial areas and stored in the corresponding plurality of partial areas.

In some embodiments, the processor of the storage device may be further configured to select, based on the data priority list, a partial area from among the plurality of partial areas of the volatile memory having a size matching a largest size from among the respective plurality of portions of the necessary data.

In some embodiments, the processor of the storage device may be further configured to select, based on the data priority list, at least one partial area from among the plurality of partial areas of the volatile memory having a size greater than or equal to a specified size.

In some embodiments, the processor of the storage device may be further configured to select, based on the data priority list, a partial area from among the plurality of partial areas of the volatile memory, which stores necessary data to be performed after the main power drops to or below the power level threshold.

In some embodiments, the processor of the storage device may be further configured to select the partial area from among the plurality of partial areas of the volatile memory having a largest size from among the respective plurality of portions storing necessary data to be performed after the main power drops to or below the power level threshold.

According to an aspect of the present disclosure, a storage device is provided. The storage device includes a nonvolatile memory, a volatile memory, a processor, and an internal spare power source. The nonvolatile memory is configured to perform, in response to a request of a host system, at least one of an input data operation and an output data operation. The volatile memory is configured to store necessary data used for the at least one of the input data operation and the output data operation. The processor is configured to control the at least one of the input data operation and the output data operation. The internal spare power source is configured to supply spare power to the volatile memory when a main power supplied by the host system drops to or below a power level threshold. The processor is further configured to receive, from the host system, a query plan corresponding to the necessary data. The processor is further configured to generate, based on the query plan, a data priority list corresponding to the necessary data. The processor is further configured to select, based on the data priority list, a first partial area of the volatile memory, when the main power drops to or below the power level threshold. The processor is further configured to shut off the spare power supplied to an unselected partial area of the volatile memory, after the necessary data has been moved to the first partial area of the volatile memory.

In some embodiments, the volatile memory of the storage device may include a plurality of memory chips. The processor of the storage device may be further configured to, when the main power drops to or below the power level threshold, select a portion of the plurality of memory chips.

In some embodiments, the processor of the storage device may be further configured to select a first memory chip of the plurality of memory chips, move the necessary data to the first memory chip, and shut off a power supply to remaining memory chips of the plurality of memory chips.

In some embodiments, the processor of the storage device may be further configured to select at least two memory chips of the plurality of memory chips, move the necessary data to the at least two memory chips, and shut off a power supply to remaining memory chips of the plurality of memory chips.

In some embodiments, the processor of the storage device may be further configured to supply spare power, from an external spare power source, to the first partial area of the volatile memory.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
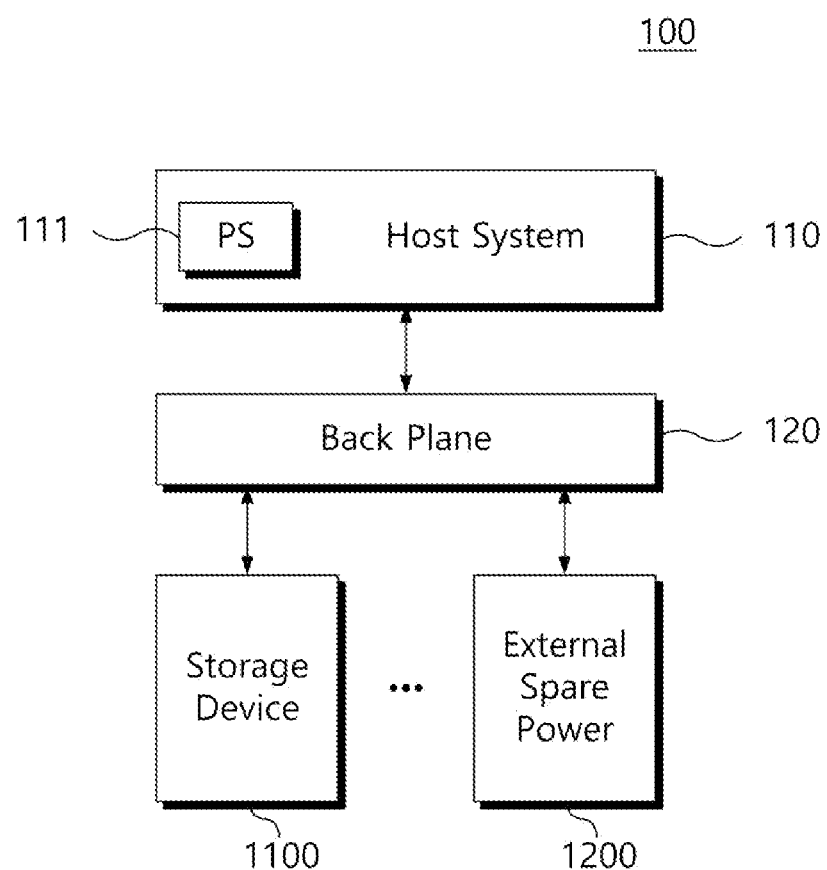
FIG. 1 is a diagram illustrating a computing system, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper", "middle", "lower", etc. may be replaced with terms, such as "first," "second," "third" to be used to describe relative positions of elements. The terms "first," "second," "third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

FIG. 1 is a diagram illustrating a computing system, according to an embodiment. Referring to FIG. 1, a computing system 100 may include a host system 110, a backplane 120, at least one storage device 1100, and at least one external spare power 1200. For example, the computing system 100 may include, but not be limited to, a personal computer (PC) and/or a server system.

According to an embodiment, the host system 110 may control the computing system 100 in totality. For example, the host system 110 may include components, which may be necessary to control the computing system 100, such as a processor, a memory, and a power supply 111. The processor and the memory (not shown) may be mounted on a main board to be operated. The power supply 111 may supply main power to the processor and the memory through the main board.

According to an embodiment, the processor may control operations of the at least one storage device 1100 and the at least one external spare power 1200. For example, the processor may be at least one of a system-on-a-chip (SoC) such as an application processor (AP) for controlling the storage device 1100, a central processing unit (CPU), a digital signal processor (DSP), and a graphics processing unit (GPU). The processor may operate various software and/or firmware stored in the memory.

According to an embodiment, to control the operations of the at least one storage device 1100 and the at least one external spare power 1200, the memory may store various software and/or firmware. For example, the memory may be a volatile memory device such as, but not limited to, a dynamic random access memory (DRAM), a synchronous dynamic random access memory (SDRAM), a double data rate (DDR) DRAM, a DDR SDRAM, a low power double data rate (LPDDR) SDRAM, a graphics double data rate (GDDR) SDRAM, a rambus dynamic random access memory (RDRAM), a static random access memory (SRAM), and/or the like.

According to an embodiment, the power supply 111 may supply power to the at least one storage device 1100 and the at least one external spare power 1200 through the backplane 120. For example, the power supply 111 may provide main power to the at least one storage device 1100. Alternatively or additionally, the power supply 111 may charge the at least one external spare power 1200.

According to an embodiment, the backplane 120 may connect (e.g., communicatively couple) the host system 110, the at least one storage device 1100, and the at least one external spare power 1200 to each other. For example, each of the at least one storage device 1100 and the at least one external spare power 1200 may be configured in the form of a module connected to a socket and/or slot, which may be provided in the backplane 120. Alternatively or additionally, the backplane 120 may include a switching block for interfacing between the at least one storage device 1100 and the host system 110.

According to an embodiment, the storage device 1100 may store data received from the host system 110. The storage device 1100 may transmit stored data at the request of the host system 110. For example, the storage device 1100 and the host system 110 may be connected to each other through a host interface (not shown). The host interface may include a standard interface such as, but not limited to, an advanced technology attachment (ATA) interface, a serial ATA (SATA) interface, a parallel ATA (PATA) interface, a small computer system interface (SCSI), an enhanced small disk interface (ESDI), Institute of Electrical and Electronics Engineers (IEEE) 1394, an integrated drive electronics (IDE) interface, a card interface, and/or a compute express link (CXL). In some embodiments, the storage device 1100 may include a data storage device based on a flash memory.

For example, the storage device 1100 may include a solid state drive (SSD), a universal flash storage (UFS), and a memory card.

According to an embodiment, when main power is not supplied from the power supply 111 of the host system 110, the external spare power 1200 may supply power to the storage device 1100. Alternatively or additionally, the external spare power 1200 may supply power to the storage device 1100 when the main power supplied from the power supply 111 of the host system 110 drops to or below a power level threshold. In some embodiments, the external spare power 1200 may include a rechargeable battery. The external spare power 1200 may be charged by receiving power from the power supply 111 of the host system 110. The external spare power 1200 may charge an internal spare power source (and/or an internal capacitor) of the storage device 1100.

Figure 2:
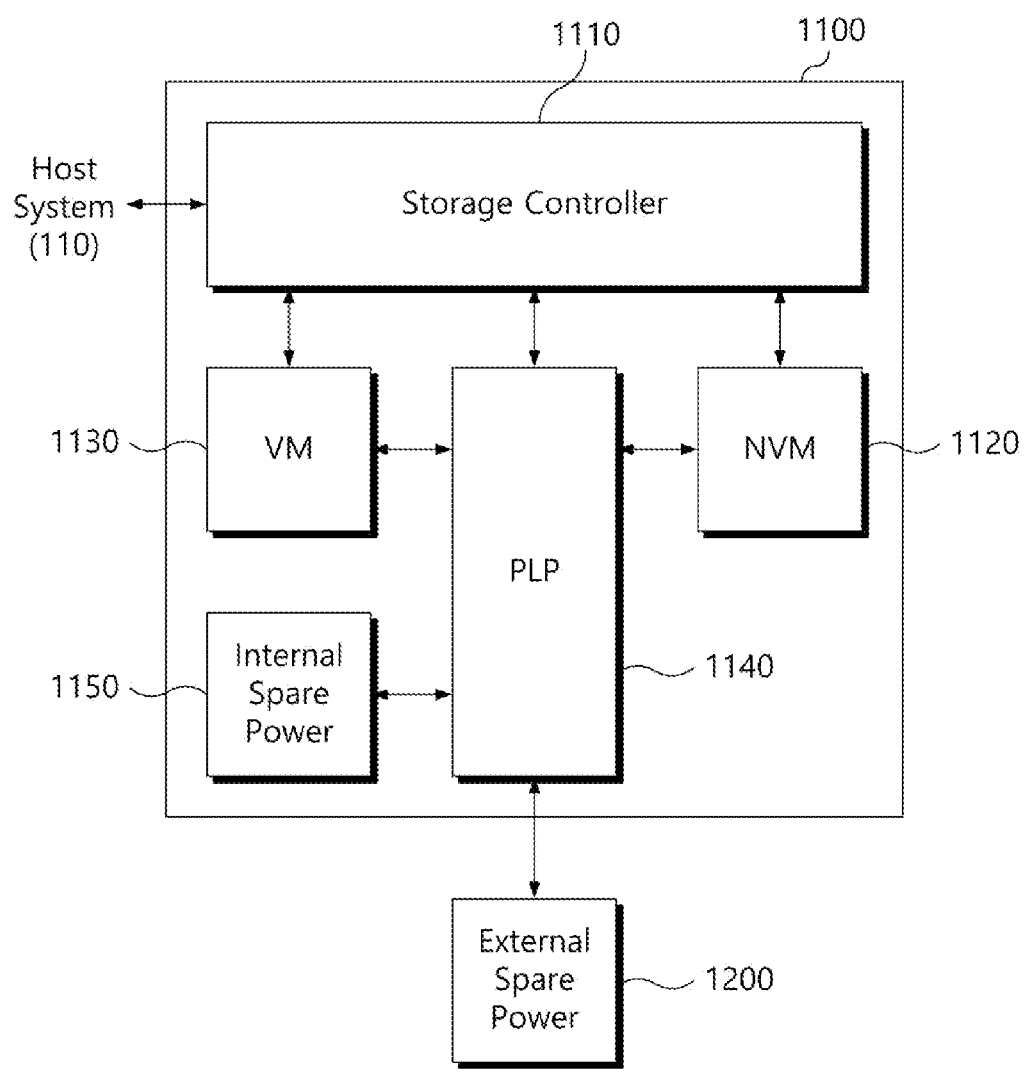
FIG. 2 is a diagram illustrating the storage device of FIG. 1, according to an embodiment.

FIG. 2 is a diagram illustrating the storage device of FIG. 1. Referring to FIG. 2, the storage device 1100 may include a storage controller 1110, a nonvolatile memory 1120, a volatile memory 1130, a power loss protection circuit 1140, and an internal spare power 1150.

According to an embodiment, the storage controller 1110 may be configured to control the nonvolatile memory 1120. For example, at the request of a host system 110, the storage controller 1110 may write data to the nonvolatile memory 1120 and/or may read out data stored in the nonvolatile memory 1120. In some embodiments, to access the nonvolatile memory 1120, the storage controller 1110 may provide a command, an address, data, and a control signal to the nonvolatile memory 1120.

According to an embodiment, the storage controller 1110 may perform an access operation of writing data to the volatile memory 1130 and/or reading out data stored in the volatile memory 1130. For example, the storage controller 1110 may provide the volatile memory 1130 with a command, an address, data, and a control signal for writing data to the volatile memory 1130 and/or reading out data stored in the volatile memory 1130. The storage controller 1110 may temporarily store data, which may be received from the host system 110 and/or the nonvolatile memory 1120, in the volatile memory 1130.

According to an embodiment, under the control of the storage controller 1110, the nonvolatile memory 1120 may input and/or output data. For example, the nonvolatile memory 1120 may include, but not be limited to, NAND flash memories, NOR flash memories, ferroelectric random access memories (FRAMs), phase change RAMs (PRAMs), thyristor RAMs (TRAMs), magnetic RAMs (MRAMs), and/or the like.

According to an embodiment, the volatile memory 1130 may be used as a working memory, a cache memory, and/or a buffer memory of the storage controller 1110. The volatile memory 1130 may be used as a cache memory of the nonvolatile memory 1120. The volatile memory 1130 may store codes and/or instructions that the storage controller 1110 executes. The volatile memory 1130 may store data processed by the storage controller 1110. For example, the volatile memory 1130 may include, but not be limited to, a DRAM, an SDRAM, a DDR DRAM, a DDR SDRAM, an LPDDR SDRAM, a GDDR SDRAM, an RDRAM, an SRAM, and/or the like. The present disclosure has been described based on a DRAM, but the technical spirit of the present disclosure is not limited thereto.

According to an embodiment, the power loss protection circuit 1140 may manage a power supply within the storage device 1100. For example, the power loss protection circuit 1140 may supply main power supplied from the power supply 111 of the host system 110 to the storage controller 1110, the nonvolatile memory 1120, and/or the volatile memory 1130. The power loss protection circuit 1140 may supply the main power supplied from the power supply 111 of the host system 110 to the internal spare power 1150. The power loss protection circuit 1140 may supply power supplied from the external spare power 1200 to the internal spare power 1150.

According to an embodiment, when the main power of the host system 110 is insufficient (e.g., sudden power off (SPO) and/or a power glitch) (and/or when the main power drops to or below a power threshold level), the power loss protection circuit 1140 may notify the storage controller 1110 that the main power of the host system 110 is insufficient. For example, when the main power from the power supply 111 of the host system 110 drops to or below a power threshold level, the power loss protection circuit 1140 may supply spare power from the internal spare power 1150 and/or the external spare power 1200 to the storage controller 1110, the nonvolatile memory 1120, and/or the volatile memory 1130. In some embodiments, when the main power drops to or below the power threshold level, the power loss protection circuit 1140 may supply power to only a specified portion of the volatile memory 1130. For example, the power loss protection circuit 1140 may be implemented as a circuit separate from the storage controller 1110. As another example, the power loss protection circuit 1140 may be implemented to be included in the storage controller 1110.

According to an embodiment, the power loss protection circuit 1140 may manage a power supply path of the internal spare power 1150 and/or the external spare power 1200. For example, the power loss protection circuit 1140 may manage a power supply path from the internal spare power 1150 to the storage controller 1110, the nonvolatile memory 1120, and/or the volatile memory 1130. The power loss protection circuit 1140 may manage a power supply path from the external spare power 1200 to the storage controller 1110, the nonvolatile memory 1120, the volatile memory 1130, and/or the internal spare power 1150.

According to an embodiment, when the main power of the host system 110 is insufficient (e.g., SPO or power glitch) (and/or when the main power drops to or below the power threshold level), the internal spare power 1150 may supply power to the storage controller 1110, the nonvolatile memory 1120, and/or the volatile memory 1130 through the power loss protection circuit 1140. The internal spare power 1150 may be charged by receiving power from the power supply 111 of the host system 110 and/or the external spare power 1200. For example, the internal spare power 1150 may include a capacitor, a super capacitor, and/or a rechargeable battery.

According to an embodiment, the storage controller 1110 may divide (e.g., partition) the volatile memory 1130 into a plurality of power supply areas and may manage a power supply for each power supply area. For example, the storage controller 1110 may allow the power loss protection circuit 1140 to supply power to the volatile memory 1130 for each power supply area. The storage controller 1110 may set an area, which redundantly receives power from the internal spare power 1150 and the external spare power 1200 in a portion of the volatile memory 1130. The storage controller 1110 may set a plurality of areas, which receives power, based on the remaining amount of the external spare power 1200.

Figure 3:
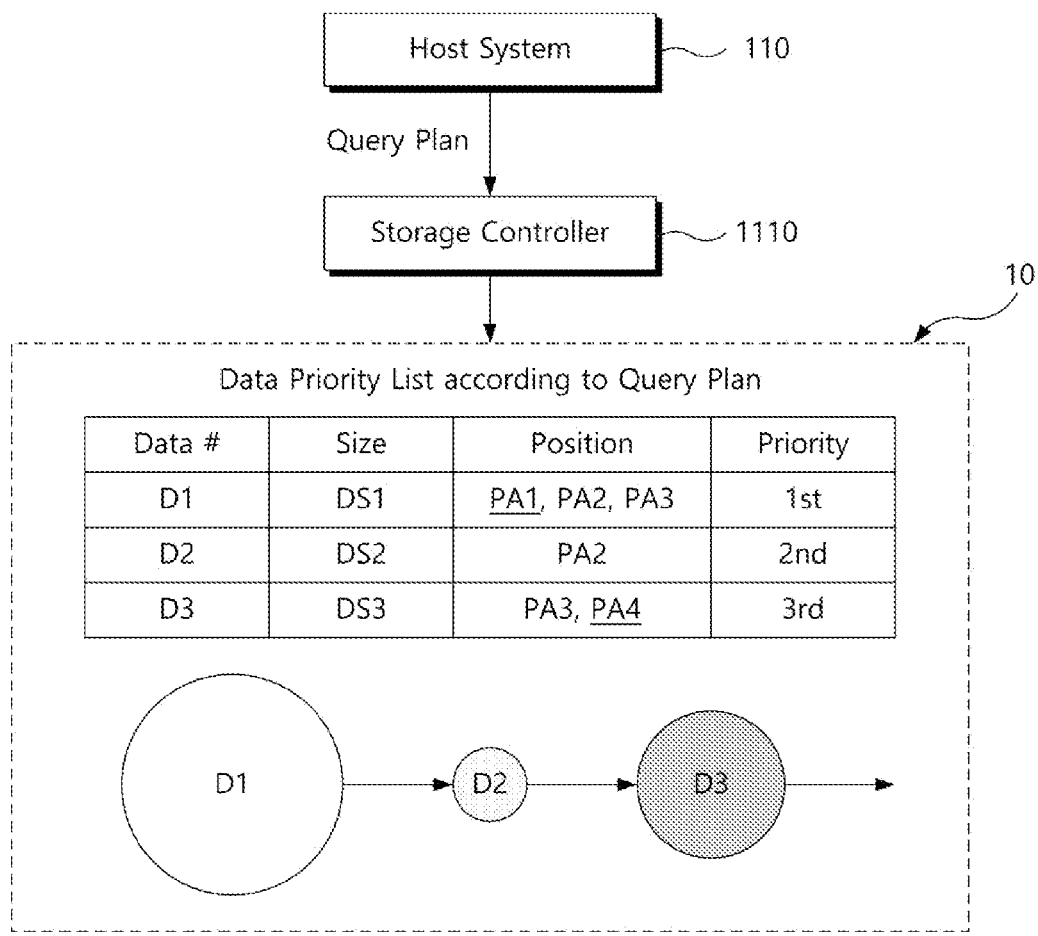
FIG. 3 is a diagram illustrating a method in which the storage controller of FIG. 2 generates a data priority list, according to an embodiment.

FIG. 3 is a diagram illustrating a method in which the storage controller of FIG. 2 generates a data priority list.

Figure 4:
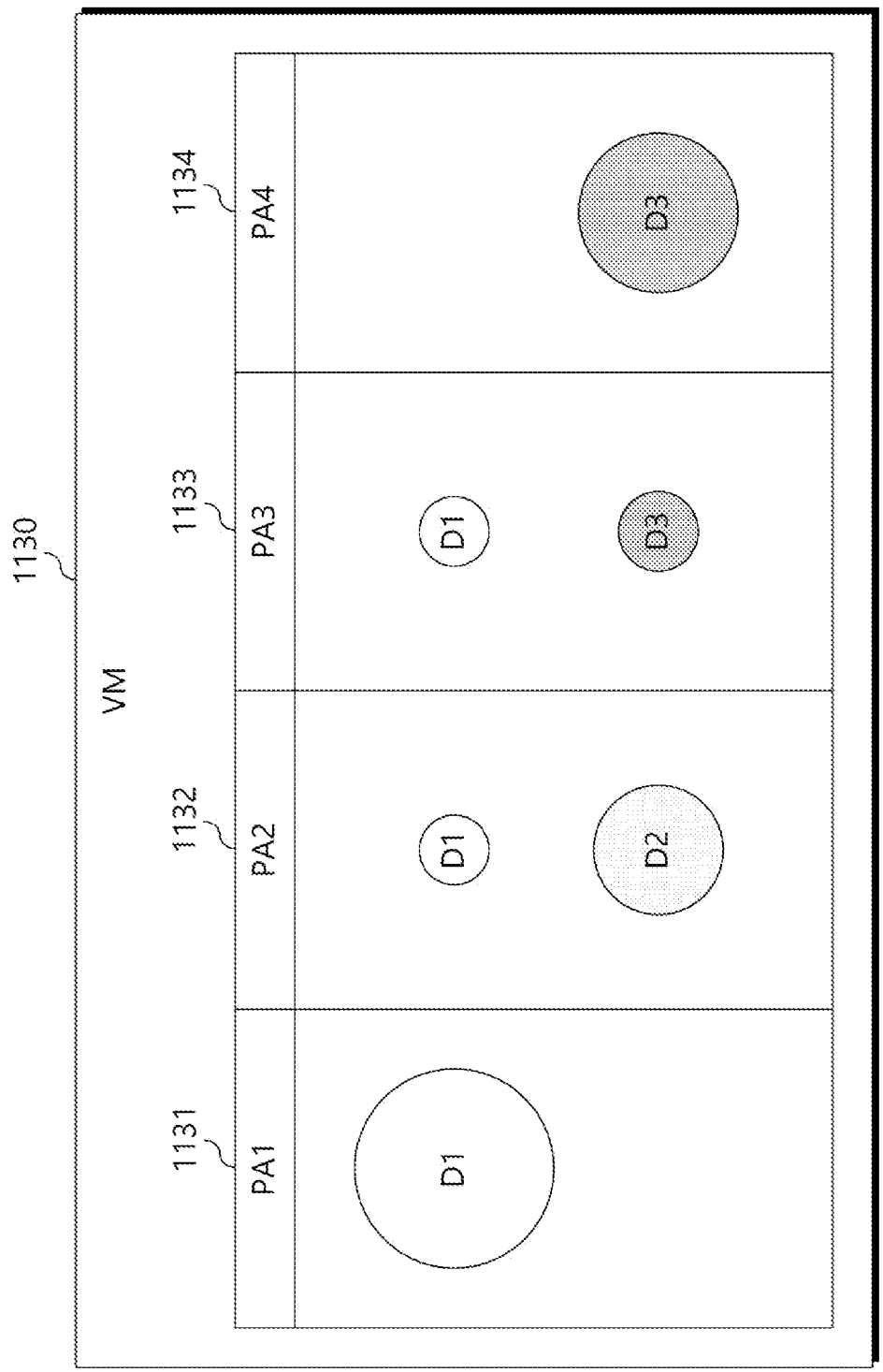
FIG. 4 is a diagram illustrating a plurality of partial areas of a volatile memory in which necessary data of FIG. 3 is distributed and stored, according to an embodiment.

FIG. 4 is a diagram illustrating a plurality of partial areas of a volatile memory in which necessary data of FIG. 3 is distributed and stored. Referring to FIG. 3, the storage controller 1110 may receive a query plan from the host system 110. For example, a part of a database structure and/or a database system may be based on a structured query language (SQL). In the SQL-based database structure and/or database system, a user and/or the host system 110 that wants to search for data stored in the storage device 1100 may deliver a query including a search target and/or a search object to the database structure and/or database system. The database structure and/or database system may analyze the query, may generate a query plan, and may search for data from the storage device 1100 depending on the query plan. The processing quality (e.g., processing speed) of the query may be determined depending on a time required to search for data depending on the query plan. As the time required to search for data increases, the processing speed of the query may decrease. Accordingly, the processing quality of the query may be reduced. To improve the processing quality (e.g., processing speed) of the query, the host system 110 may establish a query plan, and the storage controller 1110 may receive the query plan from the host system 110.

Referring to FIG. 4, the storage controller 1110 may divide (e.g., partition) the volatile memory 1130 into a plurality of partial areas and then may divide and store necessary data in the plurality of partial areas. The necessary data may include data temporarily stored to be stored in the nonvolatile memory 1120, data temporarily stored to be transmitted to the host system 110, and/or data required for an operation of the storage device 1100. For example, the storage controller 1110 may divide the volatile memory 1130 into a first partial area 1131, a second partial area 1132, a third partial area 1133, and/or a fourth partial area 1134. However, the present disclosure is not limited in this regard. For example, the volatile memory 1130 may be divided into at least two or more partial areas. The plurality of partial areas of the volatile memory 1130 may be divided through a logical division unit and/or a physical division unit (e.g., a memory chip unit). First necessary data D1, second necessary data D2, and/or third necessary data D3 may be distributed and stored in the first partial area 1131, the second partial area 1132, the third partial area 1133, and/or the fourth partial area 1134.

According to an embodiment, the storage controller 1110 may generate a data priority list 10 based on a query plan. The data priority list 10 may include detailed information of necessary data, which is divided and stored in the plurality of partial areas. The data priority list 10 may include information such as, but not limited to, an execution order of the necessary data, a size of the necessary data, and/or a storage position of the necessary data. For example, the storage controller 1110 may receive the query plan corresponding to the first necessary data D1, the second necessary data D2, and/or the third necessary data D3. On the basis of the query plan, the storage controller 1110 may generate the data priority list 10 for setting the first necessary data D1 to the first rank, setting the second necessary data D2 to the second rank, and setting the third necessary data D3 to the third rank. However, the present disclosure is not limited in this regard. For example, the number and/or size of data included in the data priority list 10 may vary. According to an embodiment, the data priority list 10 may include size information of the necessary data. For example, the first necessary data D1 may have a first data size DS1. The second necessary data D2 may have a second data size DS2. The third necessary data D3 may have a third data size DS3.

According to an embodiment, the data priority list 10 may include a position where necessary data is stored. In addition, the data priority list 10 may include information about a partial area where the maximum portion of necessary data is stored. For example, the first necessary data D1 may be stored in the first partial area 1131, the second partial area 1132, and the third partial area 1133. The maximum portion of the first necessary data D1 may be stored in the first partial area 1131. The second necessary data D2 may be stored in the second partial area 1132. The maximum portion of the second necessary data D2 may be stored in the second partial area 1132. The third necessary data D3 may be stored in the third partial area 1133 and the fourth partial area 1134. The maximum portion of the third necessary data D3 may be stored in the fourth partial area 1134.

Figure 5:
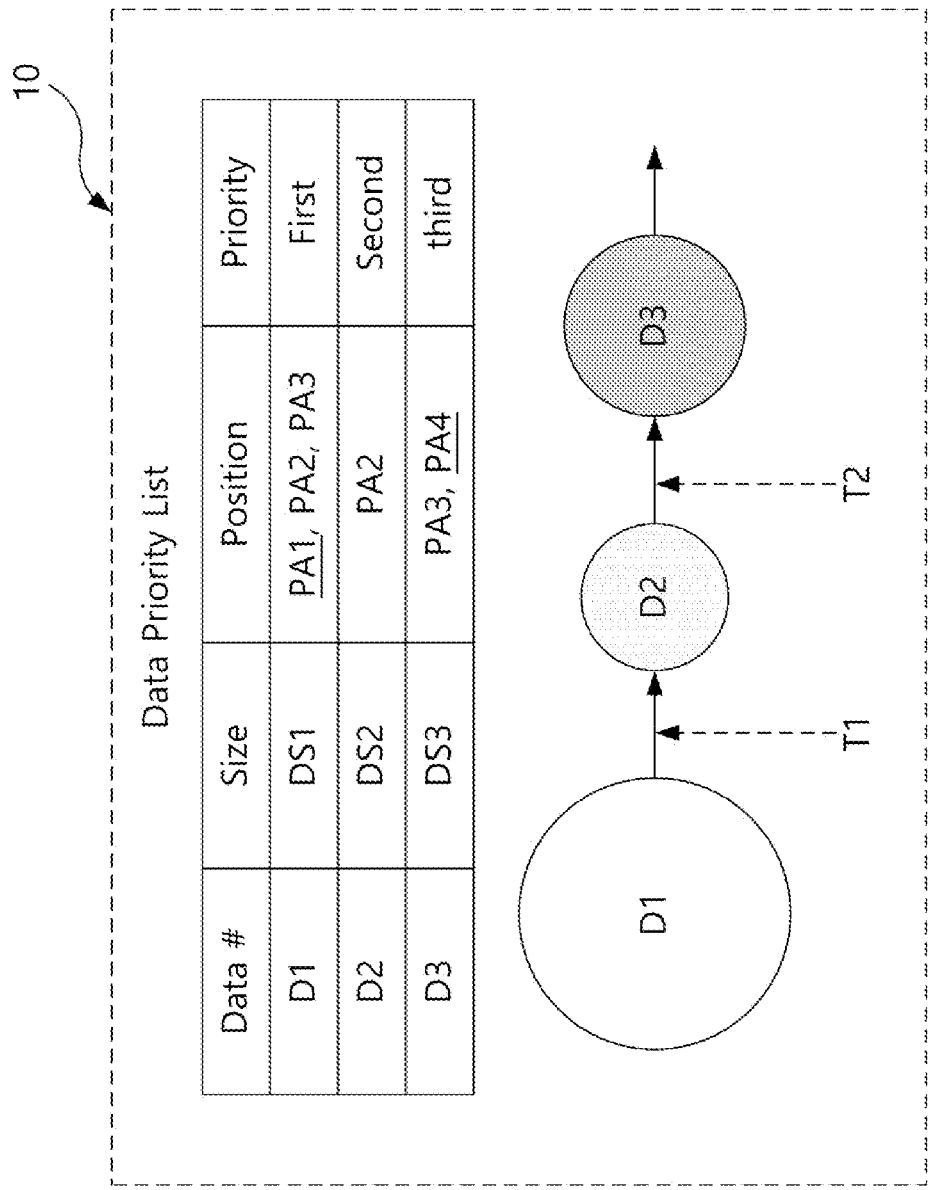
FIG. 5 is a diagram illustrating a data priority list generated by the storage controller of FIG. 3, according to an embodiment.

FIG. 5 is a diagram illustrating a data priority list generated by the storage controller of FIG. 3. FIGS. 6 to 10 are diagrams illustrating various methods of moving necessary data in a volatile memory based on the data priority of FIG. 5 when a main power of a host system drops to or below a power threshold level. Referring to FIGS. 5 to 10, when main power of the host system 110 drops to or below a power threshold level (e.g., when the main power of the host system 110 is insufficient (e.g., SPO or power glitch)), the storage controller 1110 may supply spare power (e.g., the internal spare power 1150 and/or the external spare power 1200) to the volatile memory 1130. The storage controller 1110 may select some of a plurality of partial areas of the volatile memory 1130 based on various criteria. The storage controller 1110 may move data stored in the volatile memory 1130 to at least one selected partial area. The storage controller 1110 (and/or the power loss protection circuit 1140) may shut off spare power supplied to an unselected partial area of the volatile memory 1130.

Figure 6:
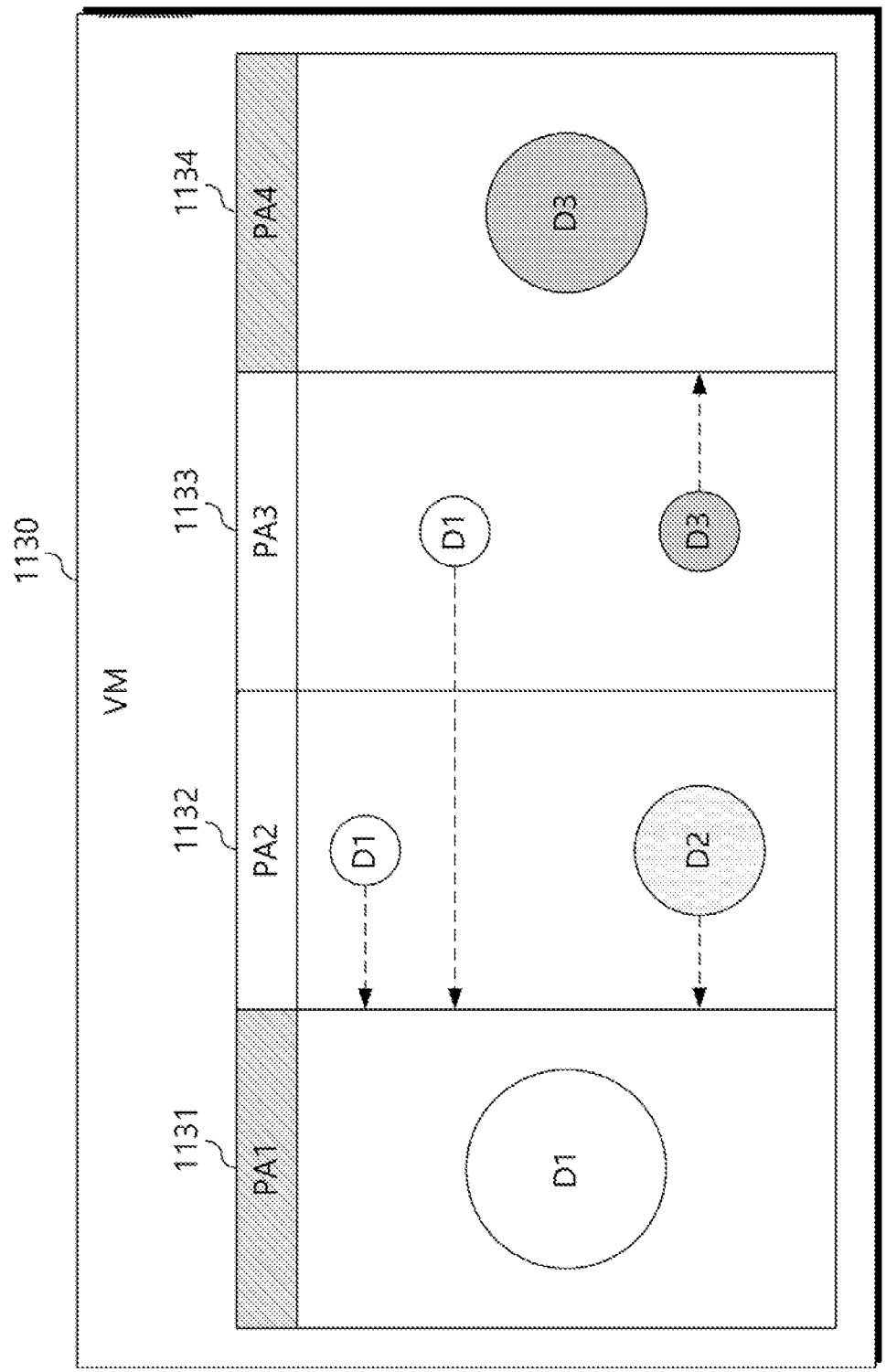
FIG. 6 is diagram illustrating a method of moving necessary data in a volatile memory based on the data priority of FIG. 5 when a main power of a host system drops to or below a power threshold level, according to an embodiment.

Referring to FIGS. 5 and 6, the storage controller 1110 may select at least one or more partial areas of the volatile memory 1130 including partial data (e.g., partial data of the first necessary data D1 and/or partial data of the third necessary data D3) having a specified size or more based on the data priority list 10. For example, the storage controller 1110 may identify partial data of the first necessary data D1, which has the greatest (e.g., largest) size in the data priority list 10, and partial data of the third necessary data D3, which has the second greatest (e.g., largest) size in the data priority list 10. The storage controller 1110 may select the first partial area 1131 including partial data of the first necessary data D1 and the fourth partial area 1134 including partial data of the third necessary data D3. The storage controller 1110 may move the remaining partial data (e.g., the first necessary data D1 and the second necessary data D2, which are stored in the second partial area 1132, and/or the first necessary data D1 and the third necessary data D3, which are stored in the third partial area 1133) to the selected partial area (e.g., the first partial area 1131 and/or the fourth partial area 1134). For example, partial data corresponding to the first necessary data D1 may be moved to the first partial area 1131. Partial data corresponding to the third necessary data D3 may be moved to the fourth partial area 1134. The second necessary data D2 may be moved to the first partial area 1131 and/or the fourth partial area 1134. The storage controller 1110 (and/or the power loss protection circuit 1140) may shut off spare power supplied to unselected partial areas (e.g., the second partial area 1132 and the third partial area 1133) after necessary data is moved.

Figure 7:
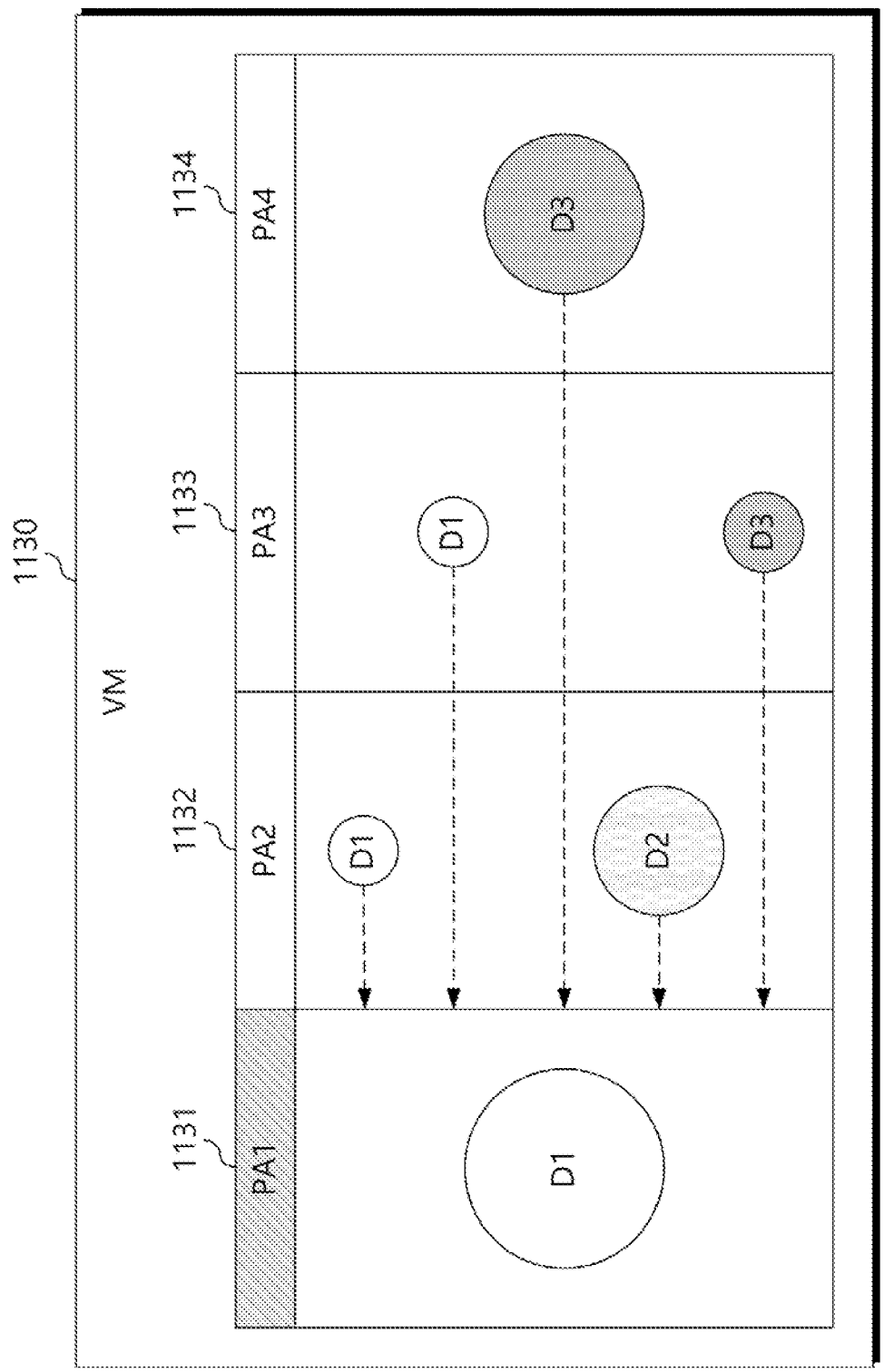
FIG. 7 is diagram illustrating another method of moving necessary data in a volatile memory based on the data priority of FIG. 5 when the main power of the host system drops to or below the power threshold level, according to an embodiment.

Referring to FIGS. 5 and 7, the storage controller 1110 may select a partial area (e.g., the first partial area 1131) of the volatile memory 1130 including partial data (e.g., partial data of the first necessary data D1) having the greatest (e.g., largest) size based on the data priority list 10. For example, the storage controller 1110 may select the first partial area 1131 including partial data having the greatest (e.g., largest) size. The storage controller 1110 may move the remaining partial data to the first partial area 1131. The storage controller 1110 (and/or the power loss protection circuit 1140) may shut off the spare power supplied to unselected partial areas (e.g., the second partial area 1132, the third partial area 1133, and the fourth partial area 1134) after the necessary data is moved.

Figure 8:
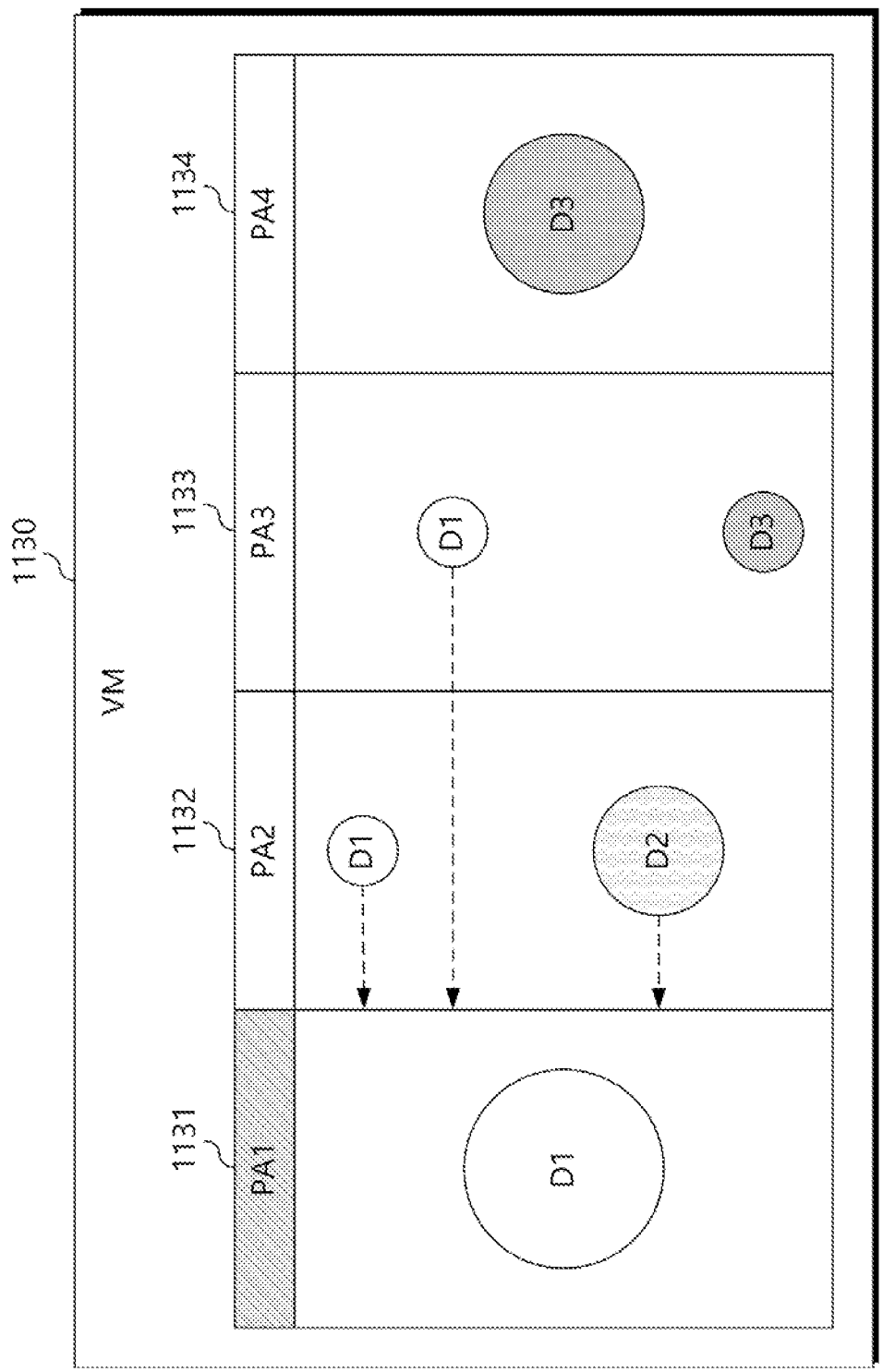
FIG. 8 is diagram illustrating another method of moving necessary data in a volatile memory based on the data priority of FIG. 5 when the main power of the host system drops to or below the power threshold level, according to an embodiment.

Referring to FIGS. 5 and 8, the storage controller 1110 may select a partial area of the volatile memory 1130 based on the priority of the data priority list 10 and/or the remaining amount of the spare power and may move data stored in the volatile memory 1130. For example, the storage controller 1110 may select the first partial area 1131 in which the maximum partial data of the first necessary data D1 having the first rank in the data priority list 10 is stored. Alternatively or additionally, the storage controller 1110 may select a partial area of the volatile memory 1130 in consideration of the remaining amount of spare power. The storage controller 1110 may determine the number of selected partial areas based on the remaining amount of spare power. The storage controller 1110 may select necessary data, which is to be moved, in consideration of the size of the selected partial area (e.g., the first partial area 1131). When all pieces of necessary data stored in the volatile memory 1130 are incapable of being moved to the selected first partial area 1131, the storage controller 1110 may move partial data of the first necessary data D1 and the second necessary data D2 to the first partial area 1131 depending on the priority of the data priority list 10, and may not move (e.g., prevent moving) the third necessary data D3. The storage controller 1110 (and/or the power loss protection circuit 1140) may shut off the spare power supplied to unselected partial areas (e.g., the second partial area 1132, the third partial area 1133, and the fourth partial area 1134) after the selected necessary data is moved.

Figure 9:
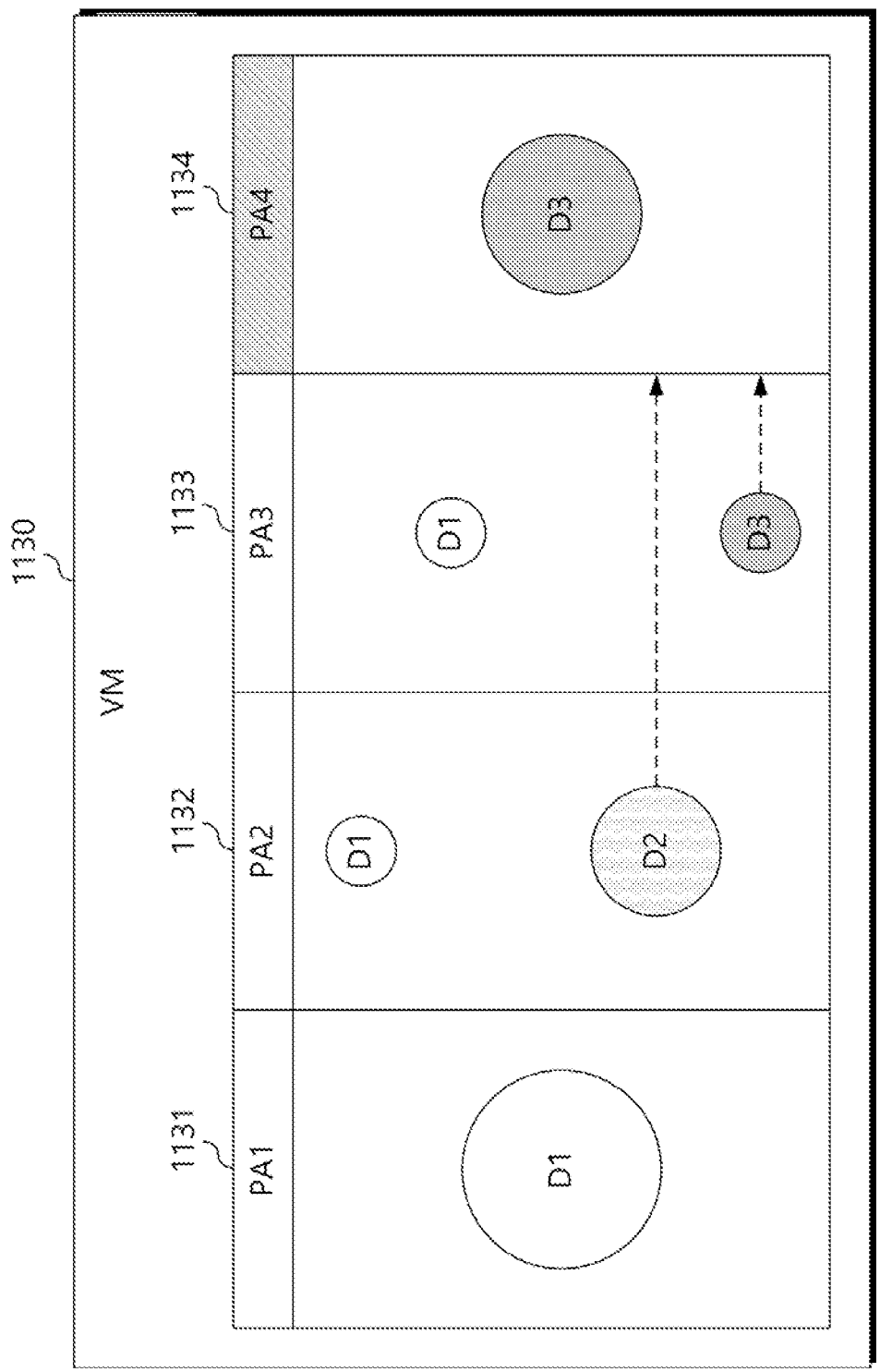
FIG. 9 is diagram illustrating another method of moving necessary data in a volatile memory based on the data priority of FIG. 5 when the main power of the host system drops to or below the power threshold level, according to an embodiment.
Figure 10:
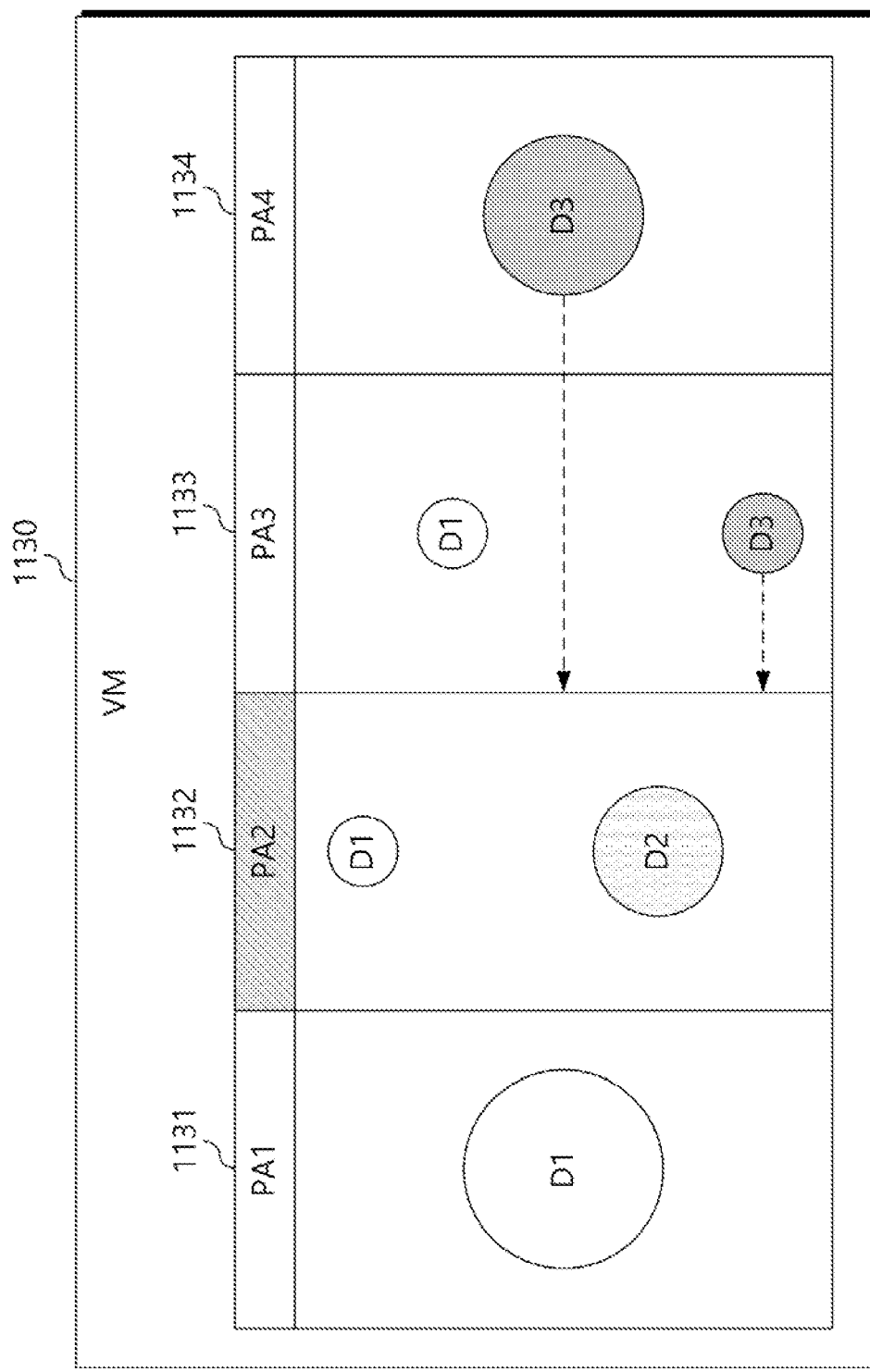
FIG. 10 is diagram illustrating another method of moving necessary data in a volatile memory based on the data priority of FIG. 5 when the main power of the host system drops to or below the power threshold level, according to an embodiment.

Referring to FIGS. 5, 9, and 10, the storage controller 1110 may select a partial area of the volatile memory 1130, in which necessary data to be performed after the main power of the host system 110 drops to or below a power threshold level is stored, based on the data priority list 10. For example, when the main power is insufficient at a first time point T1 of FIG. 5, the storage controller 1110 may select a partial area of the volatile memory 1130 including the second necessary data D2 and/or partial data of the third necessary data D3, other than the first necessary data D1, which has already been performed before the first time point T1.

For example, in FIG. 9, the storage controller 1110 may select the fourth partial area 1134, in which maximum partial data among the second necessary data D2 and the third necessary data D3 is stored. The storage controller 1110 may move the second necessary data D2 and the remaining partial data of the third necessary data D3 to the fourth partial area 1134. The storage controller 1110 may not move (e.g., prevent moving) the first necessary data D1 that has already been performed. The storage controller 1110 (and/or the power loss protection circuit 1140) may shut off the spare power supplied to unselected partial areas (e.g., the first partial area 1131, the second partial area 1132, and the third partial area 1133) after the selected necessary data is moved.

As another example, in FIG. 10, the storage controller 1110 may select the second partial area 1132 in which the second necessary data D2 having a high priority in the data priority list 10 is stored. The storage controller 1110 may move pieces of partial data of the third necessary data D3, which are distributed, to the second partial area 1132. The storage controller 1110 may not move (e.g., prevent moving) the first necessary data D1 that has already been performed. The storage controller 1110 (and/or the power loss protection circuit 1140) may shut off the spare power supplied to unselected partial areas (e.g., the first partial area 1131, the third partial area 1133, and the fourth partial area 1134) after the selected necessary data is moved.

According to various embodiments, although not illustrated in drawings, when the main power is insufficient at a second time point T2 of FIG. 5, the storage controller 1110 may select a partial area of the volatile memory 1130 including partial data of the third necessary data D3, other than the first necessary data D1 and the second necessary data D2 that have already been performed before the second time point T2. The storage controller 1110 may select the fourth partial area 1134, in which maximum partial data of the third necessary data D3 is stored. The storage controller 1110 may move pieces of partial data of the third necessary data D3, which are distributed, to the fourth partial area 1134. The storage controller 1110 may not move (e.g., prevent moving) the first necessary data D1 and the second necessary data D2 that have already been performed. The storage controller 1110 (and/or the power loss protection circuit 1140) may shut off the spare power supplied to unselected partial areas (e.g., the first partial area 1131, the second partial area 1132, and the third partial area 1133) after the selected necessary data is moved.

As described above, when the main power is insufficient, the storage device 1100 may supply spare power (e.g., the internal spare power 1150 and/or the external spare power 1200) to the volatile memory 1130. When the main power is insufficient, the storage controller 1110 of the present disclosure may move necessary data stored in the volatile memory 1130 to the selected partial area of the volatile memory 1130 depending on the data priority list 10 generated based on the query plan received from the host system 110. Moreover, the storage controller 1110 may shut off a spare power supply to the unselected partial area of the volatile memory 1130. Accordingly, until the main power of the host system 110 is restored, the storage device 1100 may protect necessary data stored in the volatile memory 1130 by using spare power.

Figure 11:
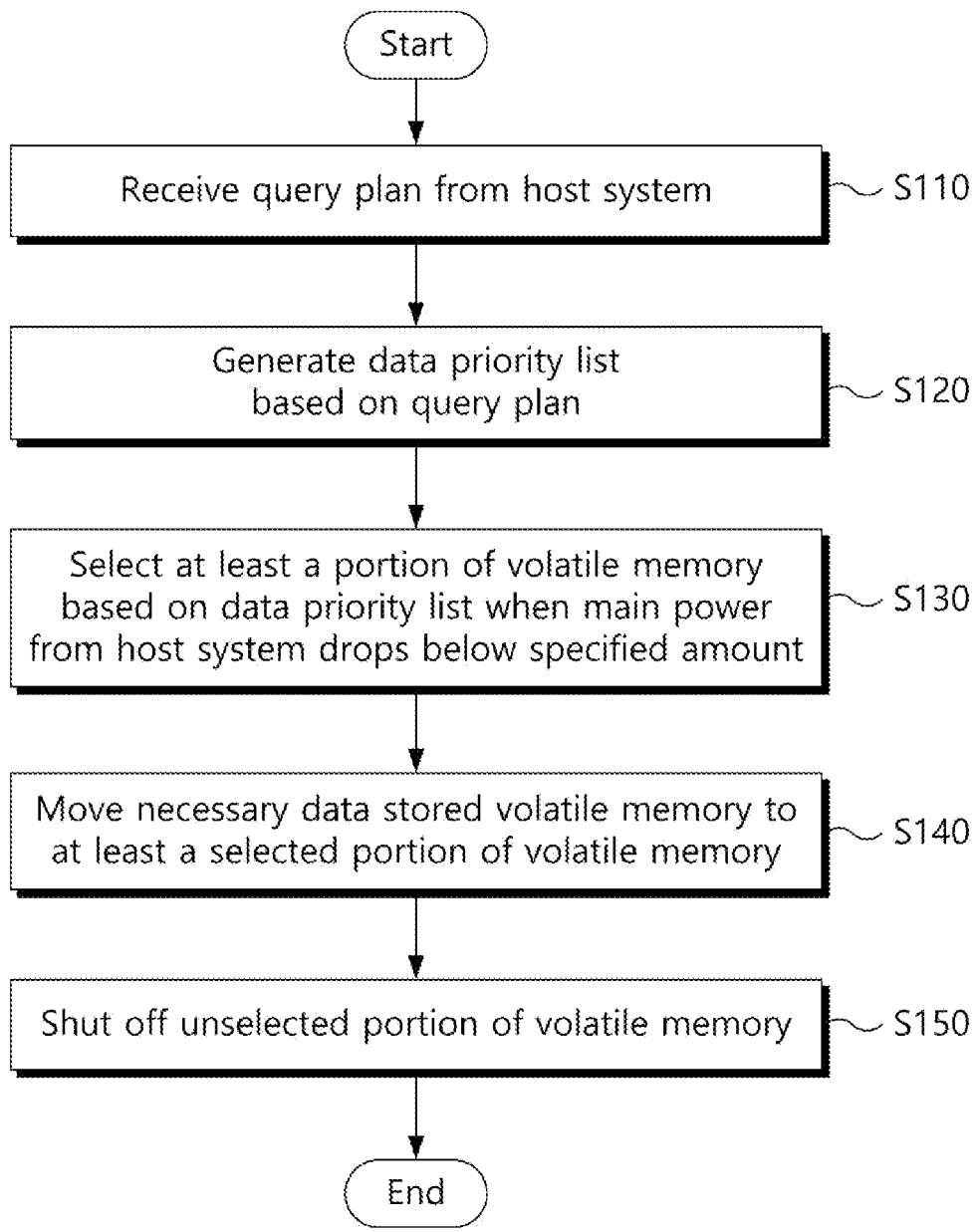
FIG. 11 is a flowchart illustrating a method for preventing data loss when power of a storage device is insufficient, according to an embodiment.

FIG. 11 is a flowchart illustrating a method for preventing data loss when power of a storage device is insufficient, according to an embodiment. Referring to FIGS. 1 to 11, the storage device 1100 may protect necessary data stored in the volatile memory 1130 based on a query plan received from the host system 110.

According to an embodiment, in operation S110, the storage controller 1110 may receive the query plan corresponding to the necessary data (e.g., the first necessary data D1, the second necessary data D2, and/or the third necessary data D3) stored in the volatile memory 1130 from the host system 110. For example, a user and/or the host system 110 which wants to search for data stored in the storage device 1100 may deliver a query including a search target and/or a search object to the database structure and/or database system. To improve the processing quality (e.g., processing speed) of the query, the host system 110 may establish a query plan, and the storage controller 1110 may receive the query plan from the host system 110.

According to an embodiment, in operation S120, the storage controller 1110 may generate the data priority list 10 (e.g., the data priority list 10 of FIGS. 3 5) corresponding to the necessary data based on the received query plan. For example, the data priority list 10 may include information such as, but not limited to, an execution order (and/or priority) of the necessary data, a size of the necessary data, and/or a storage position of the necessary data. The volatile memory 1130 may be managed by being divided into a plurality of partial areas. Referring to FIG. 4, for example, the volatile memory 1130 may be divided into the first partial area 1131, the second partial area 1132, the third partial area 1133, and the fourth partial area 1134. The storage controller 1110 may divide necessary data (e.g., the first necessary data D1, the second necessary data D2, and the third necessary data D3) into pieces of data and then may store the pieces of data in the first partial area 1131, the second partial area 1132, the third partial area 1133, and the fourth partial area 1134.

According to an embodiment, when main power from the host system 110 drops to or below a power threshold level, in operation S130, the storage controller 1110 may select at least a portion of the volatile memory 1130 based on the data priority list 10. For example, in the case of FIG. 6, the storage controller 1110 may select at least one partial area (e.g., the first partial area 1131 and the fourth partial area 1134) of the volatile memory 1130 including partial data (e.g., partial data of the first necessary data D1 and/or partial data of the third necessary data D3) of a specified size or more based on the data priority list 10. Moreover, in the case of FIG. 7, the storage controller 1110 may select a partial area (e.g., the first partial area 1131) of the volatile memory 1130 including partial data (e.g., partial data of the first necessary data DO having the greatest (e.g., largest) size based on the data priority list 10. Furthermore, in the case of FIG. 8, the storage controller 1110 may select a partial area (e.g., the first partial area 1131) of the volatile memory 1130 based on the priority of the data priority list 10 and/or the remaining amount of spare power. Besides, in the case of FIGS. 9 and/or 10, the storage controller 1110 may select a partial area (e.g., the second partial area 1132 and/or the fourth partial area 1134) of the volatile memory 1130, in which necessary data to be performed after the main power of the host system 110 drops to or below a power threshold level is stored, based on the data priority list 10.

For example, the storage controller 1110 may select the first partial area 1131 in which the maximum partial data of the first necessary data D1 having the first rank in the data priority list 10 is stored. Alternatively or additionally, the storage controller 1110 may select a partial area of the volatile memory 1130 in consideration of the remaining amount of spare power. The storage controller 1110 may determine the number of selected partial areas based on the remaining amount of spare power. The storage controller 1110 may select necessary data, which is to be moved, in consideration of the size of the selected partial area (e.g., the first partial area 1131).

According to an embodiment, in operation S140, the storage controller 1110 may move necessary data stored in the volatile memory 1130 to at least a selected portion of the volatile memory 1130. For example, in the case of FIG. 6, the storage controller 1110 may move the remaining partial data (e.g., the first necessary data D1 and the second necessary data D2, which are stored in the second partial area 1132, and/or the first necessary data D1 and the third necessary data D3, which are stored in the third partial area 1133) to the selected partial area (e.g., the first partial area 1131 and/or the fourth partial area 1134). Moreover, in the case of FIG. 7, the storage controller 1110 may move the remaining partial data to the first partial area 1131. Furthermore, in the case of FIG. 8, the storage controller 1110 may move only the selected partial data to the selected partial area (e.g., the first partial area 1131) based on the data priority list 10. Besides, in the case of FIGS. 9 and/or 10, the storage controller 1110 may move the remaining partial data to a partial area (e.g., the second partial area 1132 and/or the fourth partial area 1134) of the volatile memory 1130, in which necessary data to be performed after the main power of the host system 110 drops to or below a power threshold level is stored. In the case of FIGS. 9 and/or 10, invalid necessary data that has already been performed may be maintained as it is, and only valid necessary data to be performed later may be moved.

According to an embodiment, in operation S150, the storage controller 1110 may shut off spare power supplied to an unselected portion of the volatile memory 1130. For example, when main power of the host system 110 drops to or below a power threshold level, the storage controller 1110 (and/or the power loss protection circuit 1140) may supply spare power (e.g., the internal spare power 1150 and/or the external spare power 1200) to the volatile memory 1130. The storage controller 1110 (and/or the power loss protection circuit 1140) may shut off spare power supplied to an unselected partial area after necessary data is moved.

As described above, when the main power is insufficient, the storage device 1100 may supply spare power (e.g., the internal spare power 1150 and/or the external spare power 1200) to the volatile memory 1130. When the main power is insufficient, the storage controller 1110 of the present disclosure may move necessary data stored in the volatile memory 1130 to the selected partial area of the volatile memory 1130 depending on the data priority list 10 generated based on the query plan received from the host system 110. Moreover, the storage controller 1110 may shut off a spare power supply to the unselected partial area of the volatile memory 1130. Accordingly, until the main power of the host system 110 is restored, the storage device 1100 may protect necessary data stored in the volatile memory 1130 by using spare power.

Figure 12:
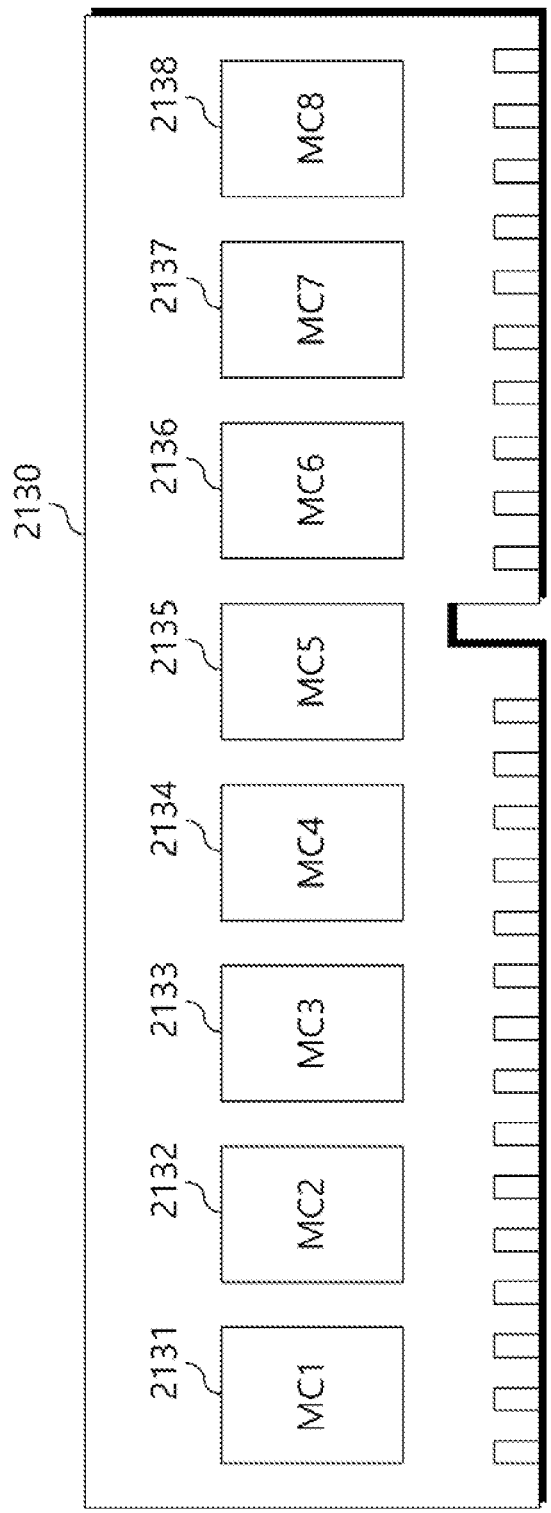
FIG. 12 is a diagram illustrating a volatile memory module included in a storage device, according to an embodiment.

FIG. 12 is a diagram illustrating a volatile memory module included in a storage device, according to an embodiment. Referring to FIG. 12, a volatile memory module 2130 may correspond to the volatile memory 1130 of FIGS. 2, 4, and 6 to 10.

According to an embodiment, the volatile memory module 2130 may include a plurality of memory chips. For example, the plurality of memory chips may include a first memory chip 2131, a second memory chip 2132, a third memory chip 2133, a fourth memory chip 2134, a fifth memory chip 2135, a sixth memory chip 2136, a seventh memory chip 2137, and an eighth memory chip 2138. However, this is an example. For example, the volatile memory module 2130 may include at least one or more memory chips.

According to an embodiment, the storage controller 1110 of FIG. 2 may manage data stored in the plurality of memory chips of the volatile memory module 2130 based on the data loss preventing method of FIG. 11. For example, one partial area of FIGS. 4 and 6 to 10 may correspond to one memory chip of the volatile memory module 2130. When main power is insufficient, the storage controller 1110 may move necessary data stored in the plurality of memory chips to at least one memory chip selected from the plurality of memory chips. The storage controller 1110 may shut off spare power supplied to the remaining memory chips other than a memory chip to which necessary data is moved.

According to an embodiment, the storage controller 1110 may set a logical partial area as shown in FIGS. 4 and 6 to 10 by grouping some of one memory chip and/or a plurality of memory chips. For example, the storage controller 1110 may set at least two or more of the first to fourth partial areas (e.g., partial areas 1131, 1132, 1133, and 1134 of FIGS. 4 and 6 to 10) in the first memory chip 2131. As another example, the storage controller 1110 may set adjacent memory chips (e.g., the first memory chip 2131 and the second memory chip 2132) to one partial area (e.g., the first partial area 1131 of FIGS. 4 and 6 to 10). As still another example, the storage controller 1110 may set memory chips (e.g., the first memory chip 2131 and the fifth memory chip 2135), which are not adjacent to each other, to one partial area (e.g., the first partial area 1131 of FIGS. 4 and 6 to 10).

The above description refers to detailed embodiments for carrying out the present disclosure. Embodiments in which a design is changed simply and/or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

According to an embodiment of the present disclosure, when the sudden main power shortage (e.g., SPO or power glitch) of a host system occurs, data stored in a volatile memory may be prevented from being lost until the main power of the host system is restored.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A data loss preventing method of a storage device, the data loss preventing method comprising:
   receiving, from a host system, a query plan corresponding to necessary data to be stored in a volatile memory;
   generating, based on the query plan, a data priority list corresponding to the necessary data;
   selecting, based on the data priority list, at least one portion of the volatile memory, when a main power supplied by the host system drops to or below a power level threshold; and
   moving the necessary data to the at least one portion of the volatile memory.

2. The data loss preventing method of claim 1, wherein the receiving of the query plan comprises:
   partitioning the volatile memory into a plurality of partial areas;
   allocating the necessary data into a respective plurality of portions corresponding to the plurality of partial areas; and
   storing the respective plurality of portions of the necessary data into the corresponding plurality of partial areas.

3. The data loss preventing method of claim 2, wherein the selecting of the at least one portion of the volatile memory comprises:
   selecting a partial area from among the plurality of partial areas of the volatile memory allocated to a corresponding portion of the respective plurality of portions of the necessary data having a size matching a largest size from among the respective plurality of portions of the necessary data.

4. The data loss preventing method of claim 2, wherein the selecting of the at least one portion of the volatile memory:
   selecting at least one partial area from among the plurality of partial areas of the volatile memory allocated to at least one corresponding portion of the respective plurality of portions of the necessary data having a size greater than or equal to a specified size.

5. The data loss preventing method of claim 2, wherein the selecting of the at least one portion of the volatile memory comprises:
   selecting, based on the data priority list, at least one partial area from among the plurality of partial areas of the volatile memory allocated to at least one corresponding portion of the respective plurality of portions of the necessary data comprising valid necessary data to be performed first after the main power drops to or below the power level threshold.

6. The data loss preventing method of claim 5, wherein the selecting of the at least one portion of the volatile memory further comprises:
   selecting a partial area from among the plurality of partial areas of the volatile memory allocated to a corresponding portion of the respective plurality of portions of the necessary data having a largest size from among the plurality of portions of the valid necessary data.

7. The data loss preventing method of claim 5, wherein the moving of the necessary data to the at least one portion of the volatile memory comprises:
   preventing moving invalid necessary data, based on the data priority list, to the at least one portion of the volatile memory, when the main power supplied by the host system drops to or below the power level threshold.

8. The data loss preventing method of claim 1, further comprising:
   supplying spare power to the volatile memory through at least one of an internal spare power source and an external spare power source, when the main power supplied from the host system drops to or below the power level threshold.

9. The data loss preventing method of claim 8, further comprising:
   shutting off a supply of the spare power supplied to an unselected portion of the volatile memory, after the necessary data has been moved to the at least one portion of the volatile memory.

10. A storage device, comprising:
    a nonvolatile memory configured to perform, in response to a request of a host system, at least one of an input data operation and an output data operation;
    a volatile memory configured to store necessary data used for the at least one of the input data operation and the output data operation; and
    a processor configured to control the at least one of the input data operation and the output data operation,
    wherein the processor is further configured to:
    receive, from the host system, a query plan corresponding to the necessary data;
    generate, based on the query plan, a data priority list corresponding to the necessary data;

select, based on the data priority list, a first partial area of the volatile memory, when a main power supplied by the host system drops to or below a power level threshold; and move the necessary data to the first partial area of the volatile memory.

11. The storage device of claim 10, wherein:

the volatile memory comprises a plurality of partial areas, the plurality of partial areas comprises the first partial area, and the necessary data is divided into a respective plurality of portions corresponding to the plurality of partial areas and stored in the corresponding plurality of partial areas.

12. The storage device of claim 11, wherein the processor is further configured to:

select, based on the data priority list, a partial area from among the plurality of partial areas of the volatile memory having a size matching a largest size from among the respective plurality of portions of the necessary data.

13. The storage device of claim 11, wherein the processor is further configured to:

select, based on the data priority list, at least one partial area from among the plurality of partial areas of the volatile memory having a size greater than or equal to a specified size.

14. The storage device of claim 11, wherein the processor is further configured to:

select, based on the data priority list, a partial area from among the plurality of partial areas of the volatile memory, which stores necessary data to be performed after the main power drops to or below the power level threshold.

15. The storage device of claim 14, wherein the processor is further configured to:

select the partial area from among the plurality of partial areas of the volatile memory having a largest size from among the respective plurality of portions storing necessary data to be performed after the main power drops to or below the power level threshold.

16. A storage device, comprising:

a nonvolatile memory configured to perform, in response to a request of a host system, at least one of an input data operation and an output data operation;

a volatile memory configured to store necessary data used for the at least one of the input data operation and the output data operation;

a processor configured to control the at least one of the input data operation and the output data operation; and an internal spare power source configured to supply spare power to the volatile memory when a main power supplied by the host system drops to or below a power level threshold, wherein the processor is further configured to:

receive, from the host system, a query plan corresponding to the necessary data;

generate, based on the query plan, a data priority list corresponding to the necessary data;

select, based on the data priority list, a first partial area of the volatile memory, when the main power drops to or below the power level threshold; and shut off the spare power supplied to an unselected partial area of the volatile memory, after the necessary data has been moved to the first partial area of the volatile memory.

17. The storage device of claim 16, wherein:

the volatile memory comprises a plurality of memory chips, and the processor is further configured to:

when the main power drops to or below the power level threshold, select a portion of the plurality of memory chips.

18. The storage device of claim 17, wherein the is further configured to:

select a first memory chip of the plurality of memory chips;

move the necessary data to the first memory chip; and shut off a power supply to remaining memory chips of the plurality of memory chips.

19. The storage device of claim 17, wherein the processor is further configured to:

select at least two memory chips of the plurality of memory chips;

move the necessary data to the at least two memory chips; and shut off a power supply to remaining memory chips of the plurality of memory chips.

20. The storage device of claim 16, wherein the processor is further configured to:

supply spare power, from an external spare power source, to the first partial area of the volatile memory.

* * * * *